US008487715B2

(12) United States Patent
Mohanty et al.

(10) Patent No.: US 8,487,715 B2
(45) Date of Patent: Jul. 16, 2013

(54) NANO ELECTROMECHANICAL INTEGRATED-CIRCUIT BANK AND SWITCH

(75) Inventors: Pritiraj Mohanty, Los Angeles, CA (US); Robert L. Badzey, Quincy, MA (US)

(73) Assignee: Trustees of Boston University, Boston, MA (US)

( * ) Notice: Subject to any disclaimer, the term of this patent is extended or adjusted under 35 U.S.C. 154(b) by 791 days.

(21) Appl. No.: 12/311,143

(22) PCT Filed: Sep. 20, 2007

(86) PCT No.: PCT/US2007/079078
§ 371 (c)(1),
(2), (4) Date: Feb. 17, 2010

(87) PCT Pub. No.: WO2008/036845
PCT Pub. Date: Mar. 27, 2008

(65) Prior Publication Data
US 2010/0134207 A1 Jun. 3, 2010

Related U.S. Application Data

(60) Provisional application No. 60/846,048, filed on Sep. 20, 2006.

(51) Int. Cl.
H03H 9/70 (2006.01)
H03H 9/74 (2006.01)
H03H 9/46 (2006.01)
H03H 9/24 (2006.01)

(52) U.S. Cl.
USPC ............................ 333/133; 333/186; 333/101

(58) Field of Classification Search
USPC .. 333/133, 186, 188, 197, 200, 101; 257/415; 977/701, 932
See application file for complete search history.

(56) References Cited

U.S. PATENT DOCUMENTS 5,914,553 A 6/1999 Adams et al.
6,124,765 A 9/2000 Chan et al.
(Continued)

FOREIGN PATENT DOCUMENTS

WO WO 98/01948 A1 1/1998
WO WO 2006/000611 A1 1/2006
(Continued)

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

(Continued)

*Primary Examiner* — Barbara Summons
(74) *Attorney, Agent, or Firm* — Wolf, Greenfield & Sacks, P.C.

(57) ABSTRACT

A bank of nano electromechanical integrated circuit filters. The bank of integrated circuit filters comprising a silicon substrate; a sacrificial layer; a device layer including at least two resonators, wherein the at least two resonators include sub-micro excitable elements and wherein the at least two resonators posses a fundamental mode frequency as well as a collective mode frequency and wherein the collective mode frequency of the at least two resonators is determined by the fundamental frequency of the sub-micron elements. At least one switch connects to the bank of integrated circuit filters.

12 Claims, 5 Drawing Sheets

U.S. PATENT DOCUMENTS

| | | | |
|---|---|---|---|
| 6,577,040 B2 | 6/2003 | Nguyen | |
| 6,710,680 B2 | 3/2004 | Niu et al. | |
| 6,737,939 B2 | 5/2004 | Hoppe et al. | |
| 6,739,190 B2 | 5/2004 | Hsu et al. | |
| 6,831,531 B1 | 12/2004 | Giousouf et al. | |
| 6,859,113 B2 | 2/2005 | Giousouf et al. | |
| 6,861,914 B2 | 3/2005 | Photiadis et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,995,622 B2 | 2/2006 | Partridge et al. | |
| 7,005,946 B2 | 2/2006 | Duwel et al. | |
| 7,211,926 B2 | 5/2007 | Quevy et al. | |
| 7,215,061 B2 | 5/2007 | Kihara et al. | |
| 7,248,128 B2 | 7/2007 | Mattila et al. | |
| 7,352,608 B2 | 4/2008 | Mohanty et al. | |
| 7,492,241 B2 | 2/2009 | Piazza et al. | |
| 7,504,909 B2 | 3/2009 | Tada | |
| 7,724,103 B2 | 5/2010 | Feng et al. | |
| 7,791,432 B2 | 9/2010 | Piazza et al. | |
| 8,063,535 B2* | 11/2011 | Mohanty et al. | 310/321 |
| 8,314,665 B2* | 11/2012 | Mohanty et al. | 333/186 |
| 2003/0186672 A1 | 10/2003 | Buchaillot et al. | |
| 2004/0061564 A1* | 4/2004 | Photiadis et al. | 331/156 |
| 2005/0073078 A1 | 4/2005 | Lutz et al. | |
| 2005/0158905 A1 | 7/2005 | Kubena et al. | |
| 2008/0047346 A1* | 2/2008 | Vyas et al. | 73/580 |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0294638 A1 | 12/2009 | Mohanty et al. | |
| 2010/0007443 A1 | 1/2010 | Mohanty et al. | |
| 2010/0155883 A1 | 6/2010 | Wenzler et al. | |

FOREIGN PATENT DOCUMENTS

| | | |
|---|---|---|
| WO | WO 2008/036830 A1 | 3/2008 |
| WO | WO 2009/048468 A1 | 4/2009 |
| WO | WO 2009/134372 A2 | 11/2009 |
| WO | WO 2010/011288 A1 | 1/2010 |

OTHER PUBLICATIONS

International Search Report and International Preliminary Report on Patentability for International Application No. PCT/US2006/021298, issued Dec. 6, 2007.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

International Search Report and Written Opinion, from PCT/US07/79078, mailed Jul. 3, 2008.

* cited by examiner

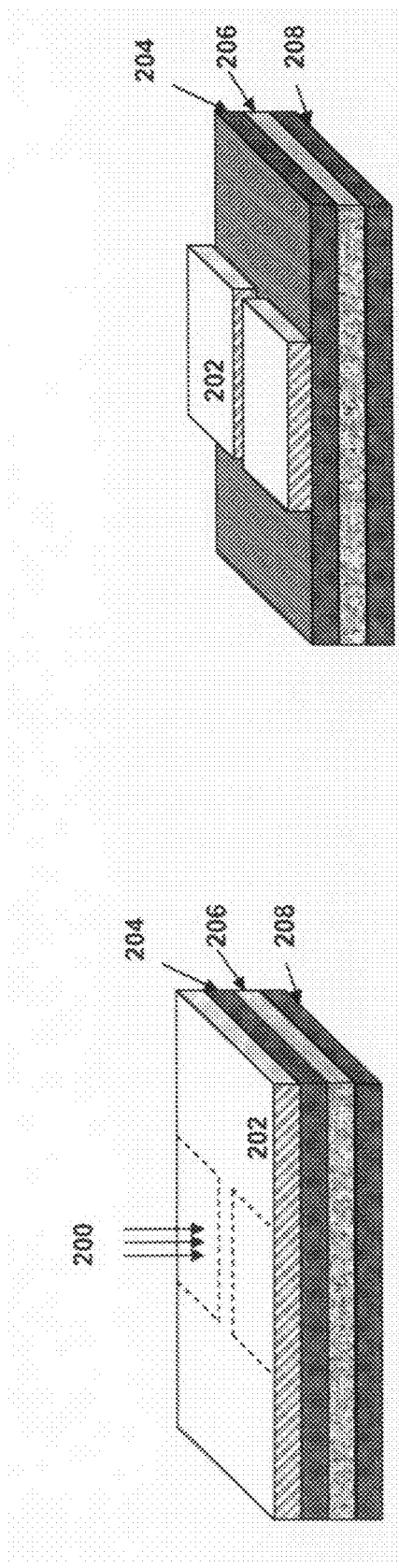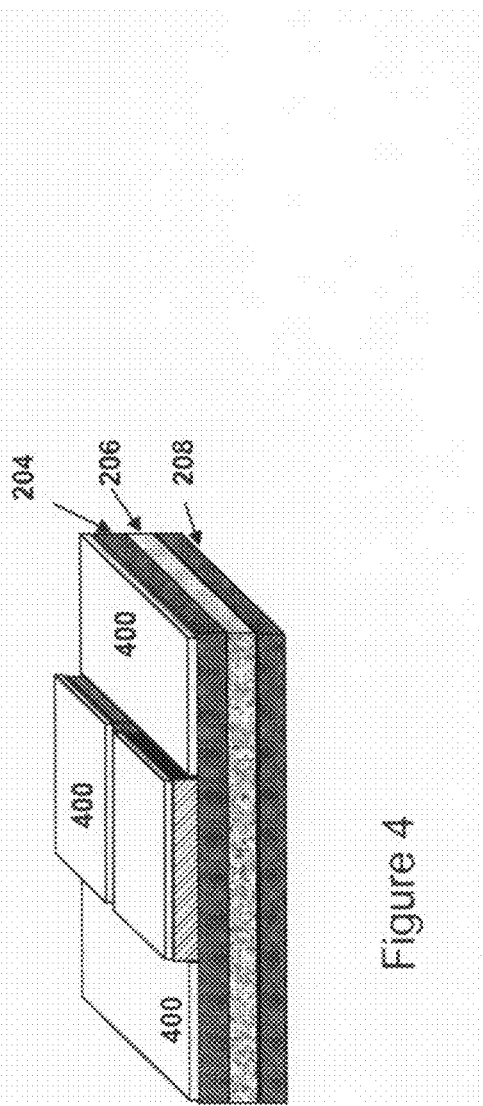

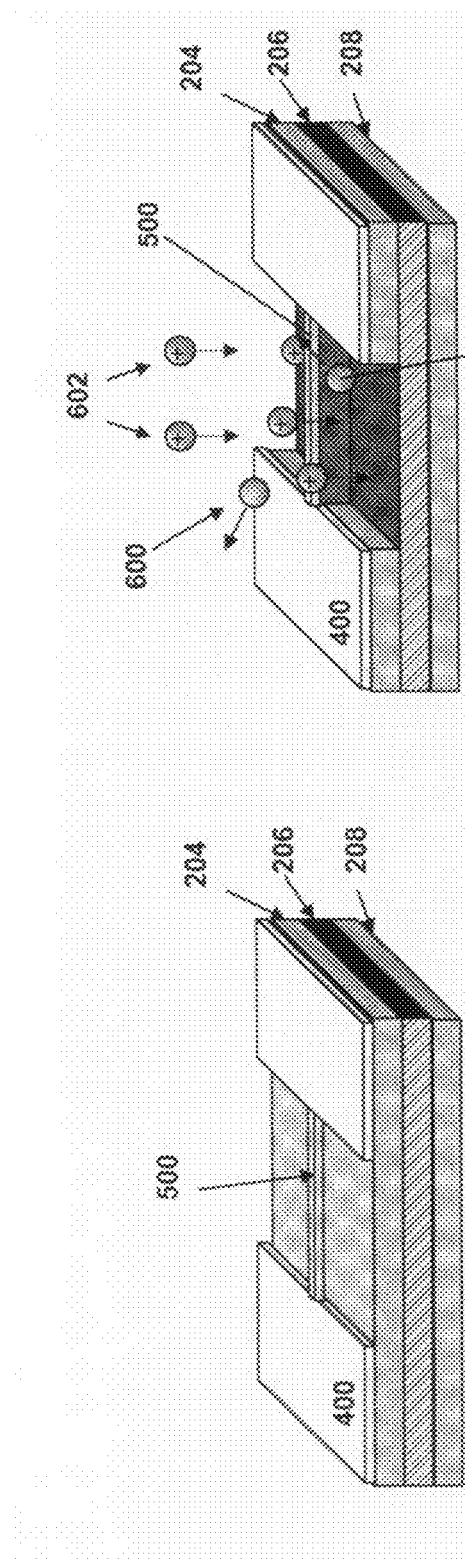
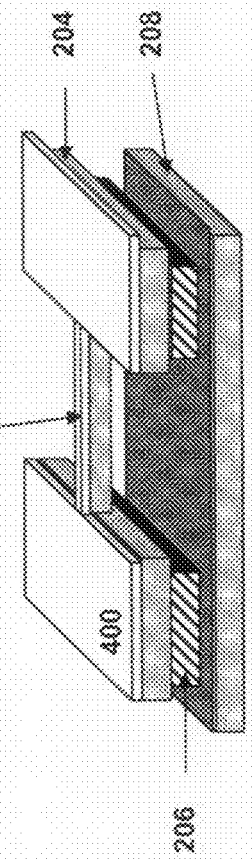
Figure 5
Figure 6
Figure 7

NANO ELECTROMECHANICAL INTEGRATED-CIRCUIT BANK AND SWITCH

RELATED APPLICATIONS

This application is a national stage application under 35 U.S.C. §371 of International Patent Application No. PCT/US2007/079078, filed Sep. 20, 2007, and entitled "NANO ELECTROMECHANICAL INTEGRATED-CIRCUIT BANK AND SWITCH," which claims the benefit under 35 U.S.C. 119(e) of U.S. Provisional Application No. 60/846,048, filed Sep. 20, 2006, and entitled "INTEGRATED NANOMECHANICAL RF FILTER BANK AND SWITCH," the entire contents of both of which are incorporated herein by reference.

GOVERNMENT SPONSORSHIP

This invention was sponsored by National Science Foundation Grant Nos. ECS-0404206 and DMR-0449670. The government has certain rights in the invention.

TECHNICAL FIELD OF THE INVENTION

The present invention relates generally to a bank of electromechanical integrated circuit filters and switches at the nanometer scale.

BACKGROUND OF THE INVENTION

Current telecommunications platforms (such as cell phones) rely on a series of radiofrequency (RF) and intermediate frequency (IF) filters in order to isolate the desired communications band or channel from the crowded and noisy background. Currently, surface acoustic wave (SAW), bulk acoustical wave (BAW), film bulk acoustic resonator (FBAR) and ceramic filters are the devices of choice. However, in general, these filters are large, bulky, and expensive discrete packaged components that cannot be integrated with the rest of the transceiver architecture. While the front-end module of the transceiver can and does continue to miniaturize with improving lithographic processes and designs, the filter stands as the bottleneck to a truly integrated radio package.

More and more, a greater number of communications standards (GSM, CDMA, PCS, European/US, UMTS) and features (WiFi, cameras) are being incorporated into a single handset. While this allows for truly global communications, it comes at the cost of a larger and more power-hungry device. Adding more bands and modes means that more and more discrete packages are added onboard, with corresponding increases in overall board size and power consumption due to package-to-package signal losses.

Therefore, a need exists for a type of filter that is small in size, utilizes minimal power and can be integrated with other discrete electrical elements. In addition, a need exists for banks of these types of filters as well as switches. Moreover, a need exists for filter banks capable of handling multiple bands or channels. Further, the capability of switching between the bands and uplink or downlink channels is also needed.

BRIEF SUMMARY OF THE INVENTION

The present invention discloses a novel bank electromechanical integrated circuit filter and switches at the nanometer scale. The bank of integrated circuit filters includes: a silicon substrate; a sacrificial layer; a device layer including at least two resonators, wherein the at least two resonators include sub-micron excitable elements and wherein the at least two resonators posses a fundamental mode frequency as well as a collective mode frequency and wherein the collective mode frequency of the at least two resonators is determined by the fundamental frequency of the sub-micron elements. At least one switch connects to the bank of integrated circuit filters.

The use of a nano electromechanical filter of the present invention allows for several advantages, including the ability to integrate such a filter on a semiconductor chip with the rest of the transceiver architecture. Removing the 10-20 discrete filter packages in a typical multimode phone and replacing them with a single IC package is obviously a huge advantage. Additionally, the ability to integrate the filters onto the same chip as the radio frequency integrated circuit (RFIC) allows for even more space and power savings. It will also allow for a single device to be sensitive to all relevant communications bands. Additionally, such a filter's small size allows for the replacement of the RF/IF heterodyning structure of the modern architecture with a tunable direct-channel-select filtering scheme, encompassing hundreds or thousands of individual filters. This type of filter would necessitate a massive redesign of the RF transceiver, but the dividends would be enormous. Among the advantages would be a fully integrated RF transceiver chip, drastically reducing production costs, RF board space, and power consumption. Additionally, a single RF transceiver would be capable of communicating on any band, in any channel, from 10 MHz up to 100 GHz or more. The transceiver could work in all of the cellular communications bands (GSM, CDMA, PCS, UMTS), wireless data bands (WiFi, EDGE, etc.), peripherals bands (Bluetooth), satellite radio, and GPS The following description and drawings set forth in detail a number of illustrative embodiments of the invention. These embodiments are indicative of but a few of the various ways in which the present invention may be utilized.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 2-7 illustrate one method of fabricating a single beam resonator;

DETAILED DESCRIPTION OF THE INVENTION

The following discussion is presented to enable a person skilled in the art to make and use the invention. The general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

Figure 1:
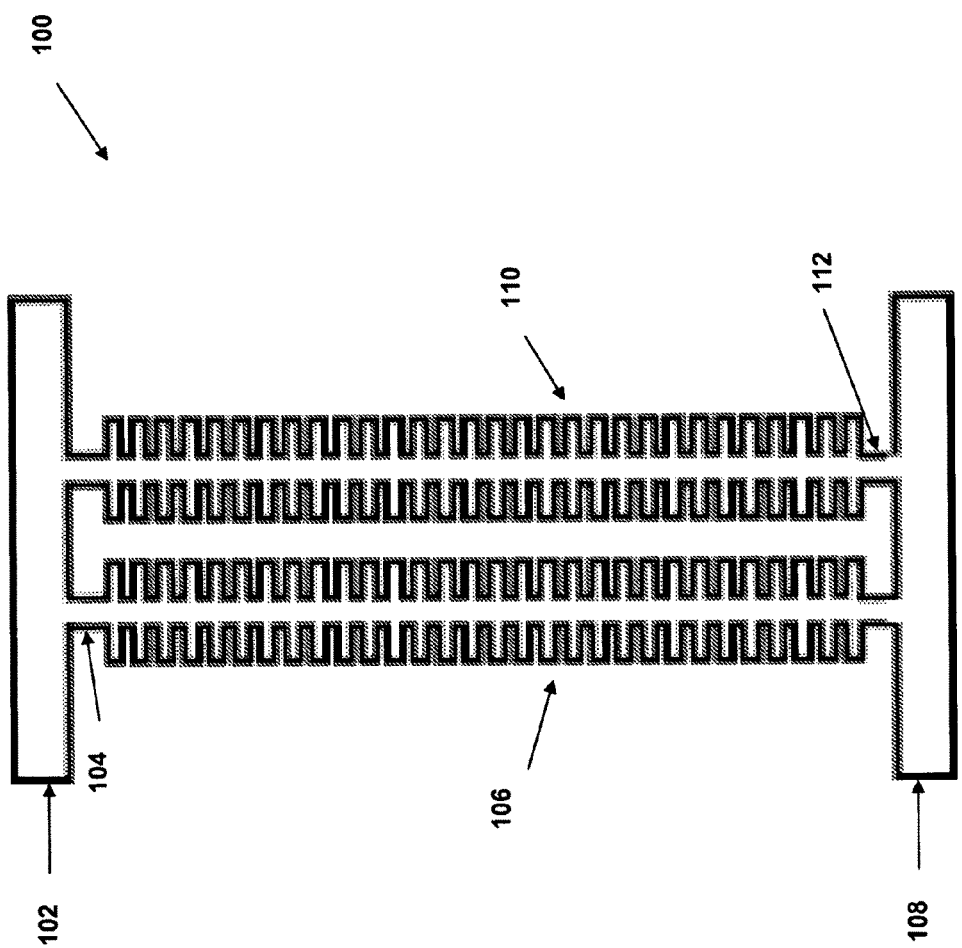
FIG. 1 illustrates an example frequency response graph of a nano electromechanical resonator.

An element of the present invention is the compound nano electromechanical resonator/filter described in concurrently filed PCT International Application Number PCT/US2007/079059, filed on Sep. 20, 2007, entitled "Nano Electromechanical Integrated-Circuit Filter, based on U.S. provisional application No. 60/846,129 assigned to Assignee. The resonator consists of a number of small elements coupled to a larger element in such a way as to possess a number of collective modes of vibration. Such collective modes are characterized by the smaller elements moving in-phase with each other, generating a corresponding displacement in the larger element. With the dimensions of the smaller elements all being less than one micron, the collective modes have natural frequencies that range from about 10 MHz to 100 GHz. The dimensions of the various elements, the material composition, method of coupling, number and location of the smaller elements with respect to the larger, and type of vibration (flexural, torsional, etc.) all work together to determine the value of the resonant frequency. By coupling two or more of these resonators together, a bandpass filter can be created by the existence of symmetric and anti-symmetric modes of vibration whose resonance peaks overlap. FIG. 1 illustrates an exemplary nano electromechanical filter. The quality factor Q of the resonator determines the effective bandwidth of this filter. In addition, the width and shape of this passband describes how well undesired signals are excluded.

FIG. 1 illustrates one embodiment of a filter 100. This embodiment of a filter 100 includes two resonators 104, 112, and each resonator includes numerous paddles, or minor elements 106, 110. Both resonators 104, 112 are suspended over a substrate (shown in FIG. 7) and attached to the substrate by coupling elements 102, 108.

One complication of the fabrication process is due to the inclusion of a coupling element or elements 102, 108. The coupling element 102, 108 add extra difficulty to the fabrication of the filter, as these coupling elements 102, 108 need to be free of electrical contacts in order to preserve each resonators' 104, 112 independence. Additionally, the structure of the coupling element 102, 108 cannot interrupt the array of minor elements 106, 110, as it is the strain coupling between the minor elements 106, 110 which allows for the generation of the high-frequency collective modes. One implementation of the coupling elements 102, 108 can be at the clamping points of the individual resonators 104, 112 (where the suspended resonator meets the unsuspended support structure shown in detail in FIG. 7). The coupling elements 102, 108 can be modified by changing the depth of the undercut and the separation between the participating resonators 104, 112. Alternatively, the coupling elements 102, 108 between the resonators 104, 112 need not be mechanical in nature—it can be capacitive, electrostatic, optical, thermomechanical, magnetic, piezoelectric/resistive, or electrodynamic.

Now, the process to create a simplified resonator will be described as illustrated in FIGS. 2-7. In this embodiment, a resonator is fabricated from silicon on a silicon-on-insulator (SOI) wafer, using a single lithography layer. The method in this embodiment of fabrication of a nano electromechanical structure includes a series of pattern/mask definitions, material deposition and etching processes. Now referring to FIG. 2, creating a silicon nano electromechanical resonator starts with an epitaxially-grown wafer 208 with required thickness of silicon 204 on top of a certain thickness of silicon oxide 206, used as the sacrificial layer. The wafer is then spin-coated with a trilayer PMMA 202 (however, this trilayer PMMA could be replaced by a bilayer PMMA) The structure patterning is then created by e-beam 200 lithography.

The wafer and pattern is then developed to create the patterned PMMA 202 as shown in FIG. 3.

After e-beam exposure and development, a selective metal mask 400 is evaporated as shown in FIG. 4.

The process then includes a liftoff technique to create the structure shown in FIG. 5, which includes a single beam 500.

As shown in FIG. 6, a directional anisotropic etch is then done by a reactive ion etch (RIE) process with positive 602 as well negative 600 particles, until the sacrificial layer 206 is completely etched out from under the beam 500. In this embodiment, the undercut is obtained by a second isotropic RIE etch or by a wet acid etch. In case of a wet acid etch, a critical-point drying process allows suspension and release of the structure without buckling. In addition, the fabrication process is designed to accommodate additional electrical lines.

The final structure is shown in FIG. 7 with the beam 500 suspended over the silicon substrate 208.

While the embodiment of FIG. 2-7 utilized lithographically with an electron-beam source, photolithography can also be used as the device dimensions are well within the feature size designated by the new deep-UV sources and masks, as well as nano imprint lithography, self assembled techniques, bottom up chemical techniques and other similar nano fabrication techniques. In general however, the fabrication steps for this embodiment were accomplished with well-established methods in the semiconductor industry. However, other embodiments can be fabricated from pure metals, metallic alloys, and alternative semiconductor compositions such as silicon carbide (SiC), GaAs, lithium tantalite, lithium niobate, diamond, metal/semiconductor or other similar compounds or any combination of the above. Quartz, aluminum nitride or other related materials may also be used for piezoelectric actuation and detection.

One of the advantages of the nanomechanical filter described above is its compatibility with existing integrated circuit (IC) fabrication technology. Embodiments of nano electromechanical resonators have been fabricated from silicon with CMOS-compatible processes. Alternative methods of fabricating filters include piezoelectric aluminum nitride (AlN) or similar materials, which are also CMOS-compatible. Each resonator/filter is a few square microns in area and can be fabricated with standard 130-nm process technology, allowing for integration of the resonator/filter with existing or future RFIC technology. Current RFIC switches are made with gallium arsenide (GaAs) or silicon-germanium (SiGe). However, silicon CMOS switches are also currently in development and show great promise. The nano electromechanical resonator/filter is compatible with all of these fabrication technologies.

Figure 8:
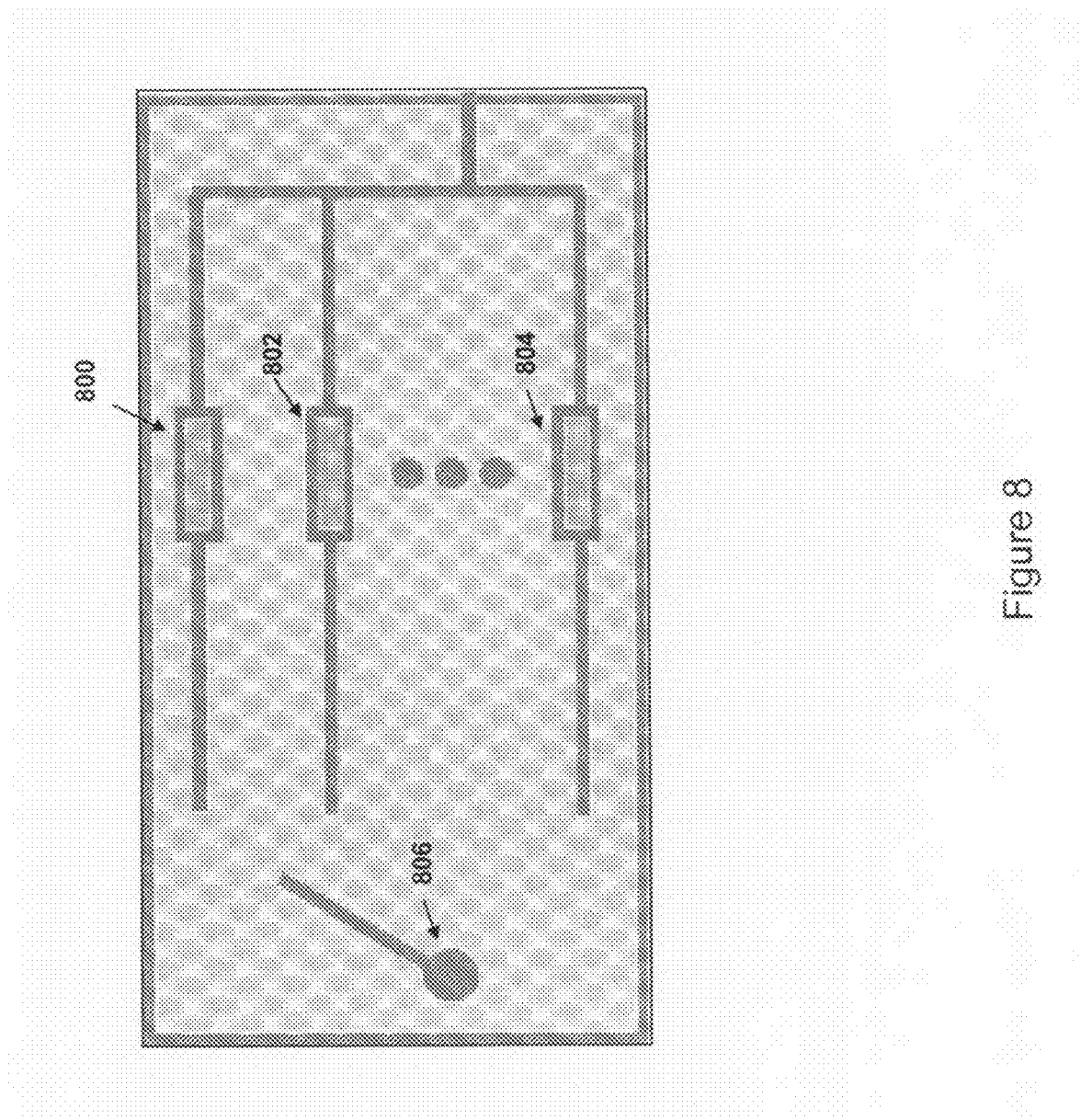
FIG. 8 illustrates one design for a bank of filters.

The present invention includes a bank of filters, each of which can cover a single communications channel within a given RF band (GSM, for example), in a single package with a multiplexing circuit capable of switching between individual channel filters, as illustrated in FIG. 8. Ideally, this entire circuit is assembled at the wafer level, with the RF switch and electromechanical filters all fabricated in a single process and integrated seamlessly. Alternatively, it is possible to fabricate the RF switch with a section of a circuit board space reserved for the subsequent placement and bonding of a discrete filter package. This entire circuit board would then be combined into a single sealed multi-chip module.

Now referring to FIG. 8, a bank of filters is illustrated. In this embodiment, a first 800 and second filter 802 and a last filter 804 are shown. However, the diagram illustrates that any number of filters could be included, but shows only three for simplicity. A switch 806 can be used to connect to any of the filters 800, 802 or 804.

The number of RF filters in a bank depends greatly on the communications band of interest. For instance, the European analog GSM standard defines the receive band from 935-960

MHz. Each channel is 200 kHz wide, therefore defining 125 channels with Q's ranging from 4675 to 4800. The transmit band is similarly defined. Thus, a circuit designed for both receive and transmit, include a single integrated switch/filter bank for each, capable of allocating any particular communications channel within a particular band. This design can be extended to any particular band or modulation scheme.

Figure 9:
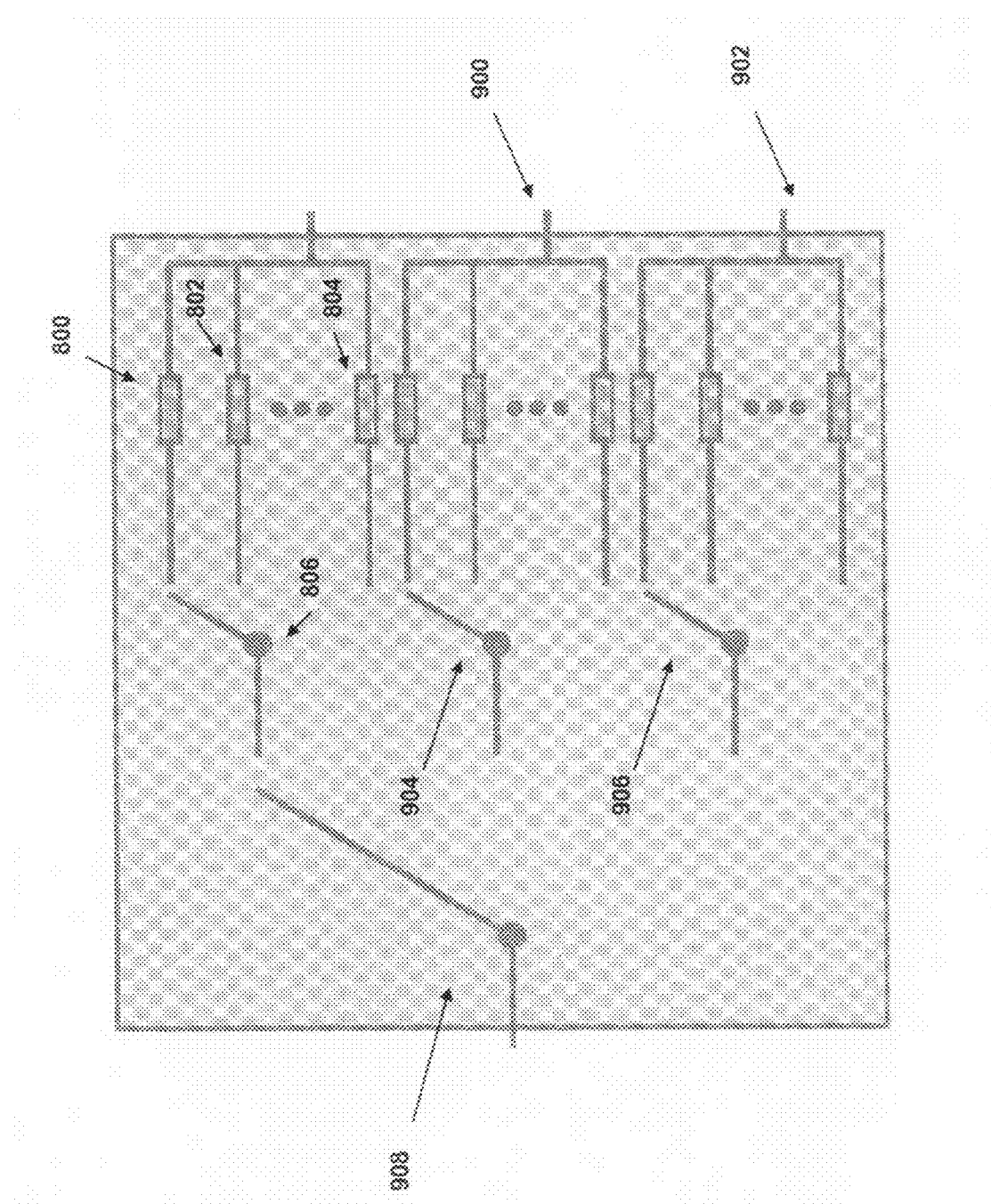
FIG. 9 illustrates another design for a set of banks of filters.

While a single 125-port switch could perform all relevant channel selections, such architecture might be challenging from a design standpoint, 8-port switches, for example, do exist and are well-proven RF designs. Several such switches can be cascaded together to accomplish channel selection, on-chip, or in one package, with a filter bank. This design can be extended to include any RF switch technology. The switch itself can be fabricated from any current or future process technology, including, but not limited to, GaAs, SiGe, GaN, and Si-CMOS. This design can be integrated completely with the filter bank at the chip level or any number of degrees removed. FIG. 9 illustrates one such bank.

Specifically, FIG. 9 includes a similar bank illustrated in FIG. 8, but includes a second 900 and a third 902 banks, along with the respective switches 904, 906. A fourth switch 908 can be used to select one of the three banks. However, many more switches and banks can be implemented, but this embodiment illustrates just three for simplicity.

There are many possibilities of using nano electromechanical or micromechanical devices as a switch. Nano electromechanical devices, such as the dynamic bistable memory elements can be exceptionally small and integrable components for such a multi-channel switch. Alternatively, MEMS switches have experienced a great amount of development over the past few years, and are possible candidates for integration. Both of these options allow for fully-integrated switch/filter packages sensitive to a wide range of communications applications.

Additionally, the nano electromechanical filter bank and/or switch can be used in many types of devices. For example, the filter may be used in, but limited to, cellular phones, PDAs, personal computers, RFID tracking devices, GPS receivers, wireless-enabled appliances and peripherals (printers, digital cameras, household appliances), satellite communications, radar communications, miniaturized communications platforms, satellite radio receivers (Sirius/XM), military communications platforms, interplanetary space probes, encrypted safety identification, MEMS device communication/control (e.g. biocompatible medical micro/nanobots controlled via integrated RF transceivers).

The previous description of the disclosed embodiments is provided to enable those skilled in the art to make or use the present invention. Various modifications to these embodiments will be readily apparent to those skilled in the art and generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A bank of integrated circuit filters, the bank comprising:
a silicon substrate;
a sacrificial layer; and
a device layer including at least two resonators, wherein the at least two resonators include sub-micron excitable elements and wherein the at least two resonators possess a fundamental mode frequency as well as a collective mode frequency and wherein the collective mode frequency of the at least two resonators is determined by the fundamental frequency of the sub-micron elements,
the bank of integrated circuit filters further comprising a first level of switches that connect to a second level of switches that connect to a filter in the bank of integrated circuit filters.

2. The bank of integrated circuit filters of claim 1, further comprising a mechanical connection between a first and a second filter within the bank of integrated circuit filters.

3. The bank of integrated circuit filters of claim 1, further comprising an electrical connection between a first and a second filter within the bank of integrated circuit filters.

4. The bank of integrated circuit filters of claim 1, wherein a collective mode frequency of at least one filter within the bank of integrated circuit filters is different than a collective mode frequency of another one within the bank of integrated circuit filters.

5. The bank of integrated circuit filters of claim 1, wherein at least one filter within the bank of integrated circuit filters is selected from the group consisting of mechanical, electrical, magnetic, optical and piezoelectric.

6. The bank of integrated circuit filters of claim 1, wherein the bank of integrated circuit filters operate at a frequency between 10 MHz-100 GHz.

7. The bank of integrated circuit filters of claim 1, wherein the sub-micron excitable elements vibrate in a mode selected from the group consisting of flexural, torsional, shear and longitudinal.

8. The bank of integrated circuit filters of claim 1, wherein the bank of integrated circuit filters are of similar frequency response.

9. The bank of integrated circuit filters of claim 1, wherein the bank of integrated circuit filters operate at multiple frequency bands.

10. The bank of integrated circuit filters of claim 1, wherein the sub-micron elements are excited by a transduction mechanism selected from the group consisting of piezoelectric, magnetomotive, magnetostatic, electrostatic capacitive transduction, optical, thermoelastic thermomechanical, and piezoresistive.

11. The bank of integrated circuit filters of claim 1, further including a connection between a first filter and a second filter within the bank of integrated circuit filters that is selected from the group consisting of capacitive, electrostatic, optical, thermomechanical, magnetic, piezoelectric/resistive and electrodynamic.

12. The bank of integrated circuit filters of claim 1, wherein the bank of integrated circuit filters is combined with other electronic elements within an integrated circuit.

* * * * *